United States Patent
Tsai et al.

(10) Patent No.: US 6,383,913 B1
(45) Date of Patent: May 7, 2002

(54) METHOD FOR IMPROVING SURFACE WETTABILITY OF LOW K MATERIAL

(75) Inventors: Cheng-Yuan Tsai, Yun-Lin; Ming-Sheng Yang, Hsin-Chu, both of (TW)

(73) Assignee: United Microelectronics Corp., Hsin-Chi (TW)

( * ) Notice: Subject to any disclaimer, the term of this patent is extended or adjusted under 35 U.S.C. 154(b) by 0 days.

(21) Appl. No.: 09/828,368

(22) Filed: Apr. 6, 2001

(51) Int. Cl.[7] .......................................... H01L 21/4763
(52) U.S. Cl. ...................... 438/624; 438/627; 438/643; 438/660
(58) Field of Search ................................ 438/296, 404, 438/424, 430, 627, 643, 660, 734, 624

(56) References Cited

U.S. PATENT DOCUMENTS

| | | | |
|---|---|---|---|
| 4,915,772 A | * | 4/1990 | Fehlner et al. ................ 117/43 |
| 5,380,678 A | * | 1/1995 | Yu et al. ...................... 438/627 |
| 5,827,755 A | * | 10/1998 | Yonehara et al. ............. 438/30 |
| 6,118,506 A | * | 9/2000 | Yamazaki et al. ........... 349/111 |

* cited by examiner

Primary Examiner—Michael S. Lebentritt
(74) Attorney, Agent, or Firm—Powell, Goldstein Frazer & Murphy

(57) ABSTRACT

A method for improving surface wettability of inorganic low dielectric material is disclosed. The method includes an inorganic dielectric material as a low-k dielectric barrier layer is spun-on the semiconductor device. Then, inorganic dielectric material surface is treated by ultraviolet (UV) treatment that the surface characteristic of inorganic dielectric material is changed from hydrophobic to hydrophilic. Thus, the surface wettability of inorganic dielectric material can be improved and adhesion ability between the inorganic dielectric material and organic polymer can be increased.

20 Claims, 3 Drawing Sheets

METHOD FOR IMPROVING SURFACE WETTABILITY OF LOW K MATERIAL

BACKGROUND OF THE INVENTION

1. Filed of the Invention

The present invention generally relates to a method for forming a dielectric material on a semiconductor device, and more particularly to a method for improving the surface wettability of the inorganic dielectric material.

2. Description of the Prior Art

Through advanced semiconductor process in techniques, integrated circuit devices with sub-micron and sub-half-micron features sizes can now be manufactured. This trend toward deep sub-micron technology (i.e., involving feature sizes less than 0.35 microns) has, in turn, driven the need for multilevel interconnect. As a result, circuit performance in the deep sub-micron regime is increasingly a function of the delay time of electronic signals traveling between the millions of gates and transistors presented on the typical integrated circuit chip. Parasitic capacitance and resistance effects resulting from these otherwise passive interconnect structures must therefore be well-controlled. Toward this end, recent researches emphasize the use of low resistance metals (e.g., copper) in conjunction with insulating material with low dielectric constant (low-k dielectrics) between metal lines. Low-k dielectric meaning that is a dielectric material, which exhibits a dielectric constant substantially less than conventional dielectric materials such as silicon dioxide, silicon nitride, and silicon oxynitride. Silicon dioxide, for example, has a dielectric constant of about 4.0. Copper is desirable in that its conductivity is relatively high and it is relatively high resistance of electromigration than many metals (for example, aluminum).

Modern semiconductor processing techniques increasingly employ Chemical-Mechanical Polishing (CMP) in the fabrication of interconnect layers, particularly where the number of layers rises above three and the conductive lines themselves are characterized by a high aspect ratio (e.g., lines on the order of 0.25 $\mu$m in width and on the order of 1.0 $\mu$m in height).

In high performance integrated circuits in the sub-0.25 $\mu$m regime, there is a need to fabricate interconnects using so-called damascene techniques. This is because conventional deposition and etching of aluminum-based metallization becomes increasingly difficult at these feature sizes. At the same time, performance considerations call for the use of lower resistivity metals such as copper, which has proven virtually impossible to pattern by using conventional reactive ion etching. Thus, the use of copper for interconnects is of great importance using an attractive damascene techniques and spurred investigation into improving these techniques.

In addition to use low resistivity metals, such as copper, circuit performance would be straightforward enhanced applying low dielectric constant insulators (k less than 4). In many cases, these low-k materials are spin coated polymers which are incompatible with conventional inorganic silicon-base material deposited by plasma enhanced chemical vapor deposition technique (PECVD), for example, SiN (silicon nitride), SiC (silicon carbide). For forming dual damascene, inorganic dielectric material, such as SiN or SiC, acting as the barrier layer is chemical deposited associated plasma environments. After that, many of low-k material for example, polymer materials spun on SiN or SiC surface. Due to the nature of SiC, however, containing Si—H and Si—CH$_3$ group, both of the two groups exhibit the hydrophobic characteristics. When organic polymer is coated on the SiC or SiN surface, poor coating/adhesion would occur between the SiC or SiN and the low-k polymer layer. In general, to improve the interface compatibility between organic and inorganic materials, before organic polymer coating an adhesion promoter would be applied and spun on inorganic surface. The improvement of surface compatibility by adhesion promoter could be attributed to both containing the bond of organic, like C—H bond and inorganic bond, like Si—O bond.

According to the above-mentioned description, for improving the adhesion ability between the inorganic dielectric material and the organic polymer, the surface characteristic such as wettability of inorganic dielectric material needs to be enhanced and then surface characteristic needs to be modified, in terms of the transition of hydrophilic to hydrophobic characteristic.

SUMMARY OF THE INVENTION

It is an object of the present invention to provide a method for improving the surface wettability of inorganic dielectric material.

It is another object of this invention to improve the adhesion ability between the inorganic dielectric material and organic polymer.

In the present invention, a method for forming organic low dielectric constant material on a semiconductor device is disclosed. Inorganic dielectric material as barrier layer with hydrophobic characteristic is deposited, followed by a treatment of UV (ultraviolet). Then the surface characteristic of inorganic dielectric material is modified from hydrophobic to less hydrophobic (more hydrophilic) and the surface wettability can be enhanced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

For dielectric materials such as inorganic dielectric material, especially for deposited by plasma enhanced chemical vapor deposition (PECVD), there are many inherent issues for these materials, for example, the adhesion ability with organic polymer. The adhesion issues, primarily indicating the wettability, are one of the key concerns for spin on process and the subsequent many process. On the other hand, inorganic dielectric material, such as SiC with a lower dielectric constant and a better resistance of copper diffusion in comparison with conventional silicon nitride (SiN), is a viable candidate in company with low-k materials for advanced generation. In order to improve the adhesion ability between organic polymer and its adjacent inorganic dielectric material, an UV (ultraviolet) treatment on SiC surface, is applied. The SiC surface characteristic will be modified be more hydrophilic and the surface wettability of SiC can be improved. The reason why using change of SiC surface could be caused by the breaking the surface Si—H and/or Si—H bond via UV illumination, resulting in the formation of Si—OH with much hydrophilic characteristic on surface.

Figure 1:
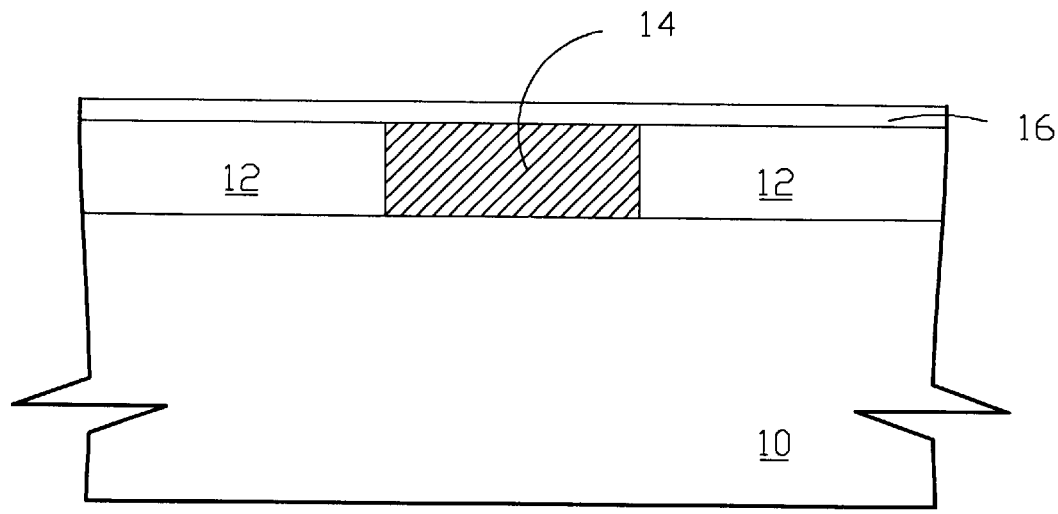
FIG. 1 is a cross-sectional view showing an interconnect structure and a low-k barrier layer are formed on the substrate.

Referring to FIG. 1, a first low-k dielectric layer 12 having a conductive region 14 is formed on a substrate 10. The conductive region 14 can be of any variety of material for forming interconnects structure on a semiconductor device. Typically, a metal, such as aluminum (Al) is used for forming the conductive regions 14 on a semiconductor device. Recent practice is using copper (Cu) to replace aluminum. For copper has higher resistance to electromigration and lower electrical resistivity than aluminum, it is a more preferred material for the interconnect wiring than aluminum. However, because of the high copper diffusivity in the dielectric materials and incompatibility with silicon materials, copper requires encapsulation to isolate it from most adjacent materials. Thus, when copper is employed as the interconnect material some barrier or encapsulation layer is required to prevent the copper from interacting with surrounding material.

Then, an inorganic dielectric material, used as a first low-k barrier layer 16, is chemical deposited on the first low-k dielectric layer 12 and portion of the conductive region 14. In the prior art technique, the SiN is used for low-k barrier layer in the interconnect structure. However, SiC film with a much lower dielectric constant has better resistance for copper diffusion than SiN in this invention.

Then, in one embodiment, the characteristic of the low-k barrier layer 16 is modified from hydrophobic to less hydrophobic or said more hydrophilic by UV treatment. UV treatment can improve the surface adhesion of inorganic dielectric material as a low-k barrier layer compatible with organic polymer. In another embodiment, an adhesion promoter also can be coated on the low-k barrier layer 16 by spin-on method with thickness less than 200 angstroms. Then, the adhesion promoter is baked at temperature between about 100 to 200° C. To remove the remained solvents on the adhesion promoter, then, a second low-k dielectric layer 18 is formed the first low-k barrier layer 16. Later, a first photoresist layer is deposited, exposed, and developed by the use of known techniques to form an opening 24 (shown in FIG. 2) to define a subsequent via opening.

Figure 2:
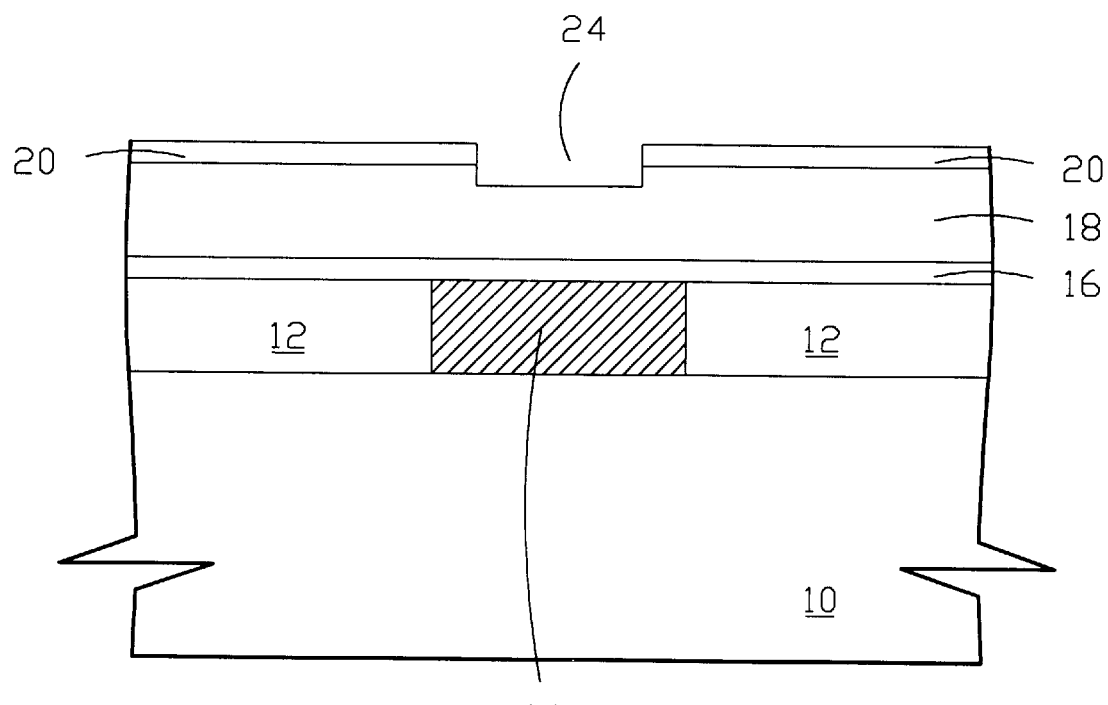
FIG. 2 is a cross-sectional view of a second dielectric layer and a second low-k barrier layer are formed on the structure of FIG. 1.
Figure 3:
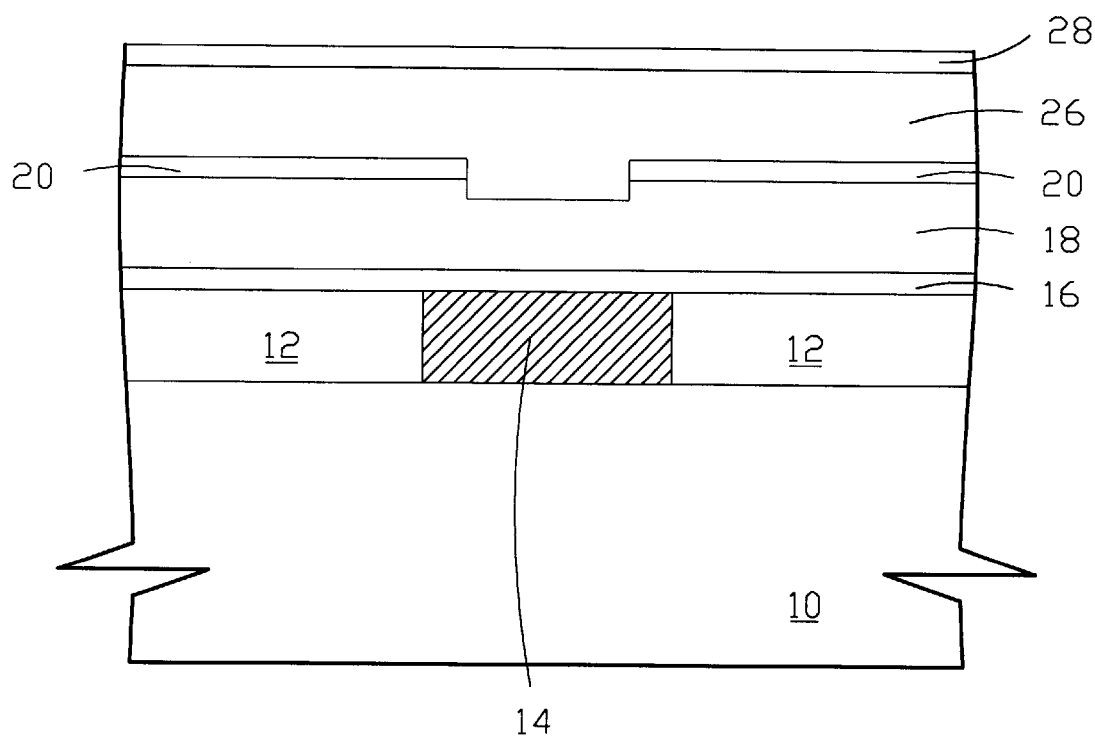
FIG. 3 is a cross-sectional view of via opening formed on the structure of FIG. 2 and third dielectric layer and a hard mask formed on the second dielectric layer.

Referring to FIG. 2 and FIG. 3, a second low-k dielectric layer 18 spun on the first low-k barrier layer 16, and then the second low-k barrier layer 20 deposited on the second low-k dielectric layer 18 by chemical vapor deposition method, such as plasma enhanced chemical vapor deposition (PECVD) method. A photoresist layer is deposited, exposed, and developed by photolithography techniques on the second low-k barrier layer 20 are to be etched. Next, an etching step utilized to remove the exposed portion of the second low-k barrier layer 20 to form an opening 24. Accordingly, the pattern in the photoresist layer transferred to second low-k barrier layer 20. Later, the opening 24 will define a location where the opening 24 is to be formed in the second low-k dielectric layer 18. Next, turning to FIG. 3, a third low-k dielectric layer 26 is also formed on the second low-k barrier layer 20 by spin on method. Next, a hard mask layer 28 is deposited on the third low-k dielectric layer 26.

Figure 4:
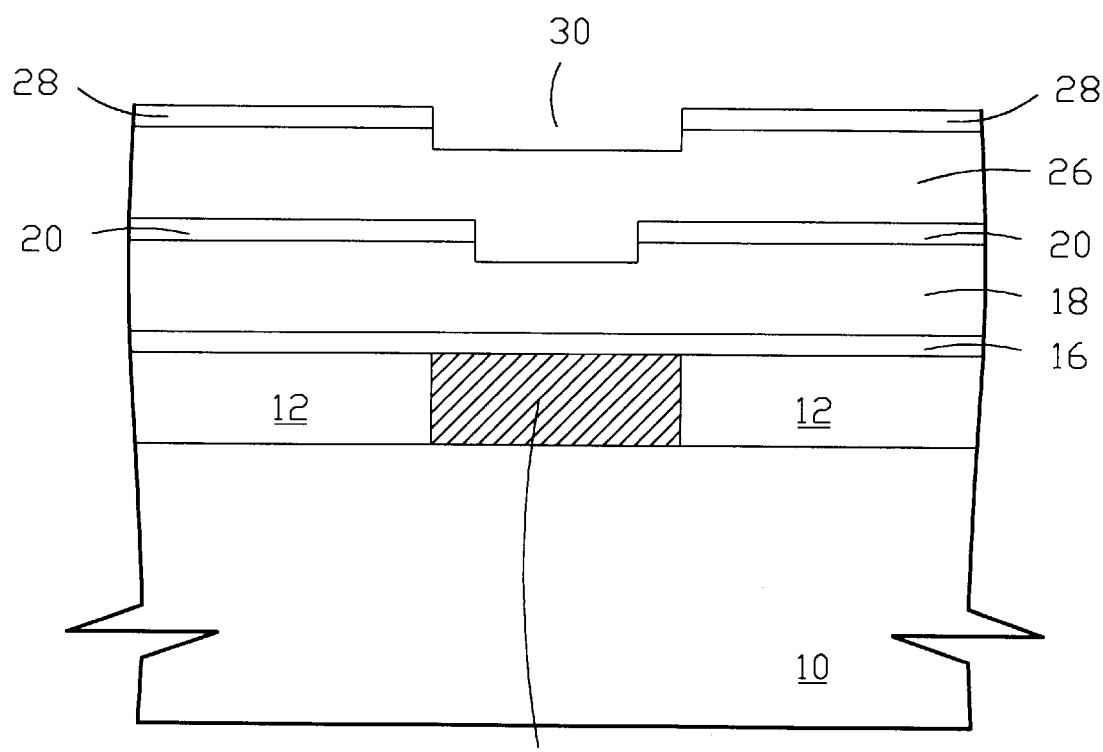
FIG. 4 is a cross-sectional view of an opening formed on the structure of FIG. 3.

Then, referring to FIG. 4, a second photoresist layer is deposited, exposed, and developed on the hard mask layer 28 by the photolithography techniques to form an opening to define a subsequent trench opening. Thus, the photolithography techniques expose the location where portions of the hard mask layer 28 are to be etched. Then, an etching step procedure performed to remove the exposed portion of the hard mask layer 28 to form an opening 30.

Figure 5:
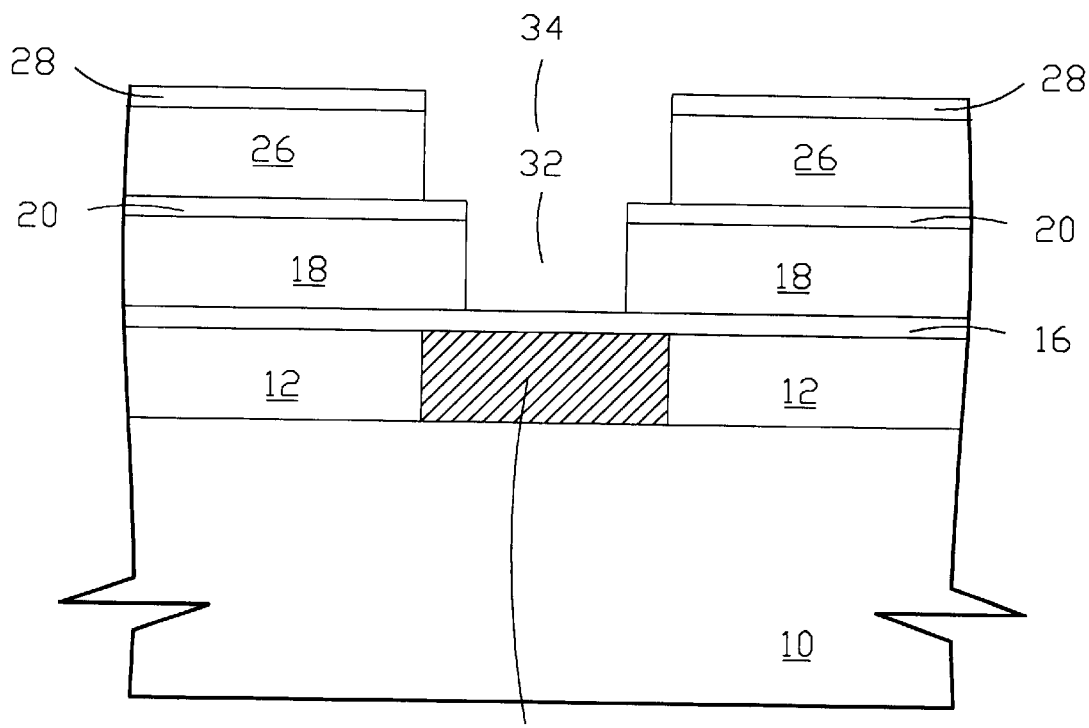
FIG. 5 is a cross-sectional view of a trench formed in the structure of FIG. 4.

Then, referring to FIG. 5, a trench opening 34 formed by using anisotropic etching process and a dual damascene formed by anisotropic etching step to etch the exposed the hard mask layer 28, third low-k dielectric layer 26 and second low-k dielectric layer 18, but the low-k barrier layers 20 and 16 will not be etched away.

Figure 6:
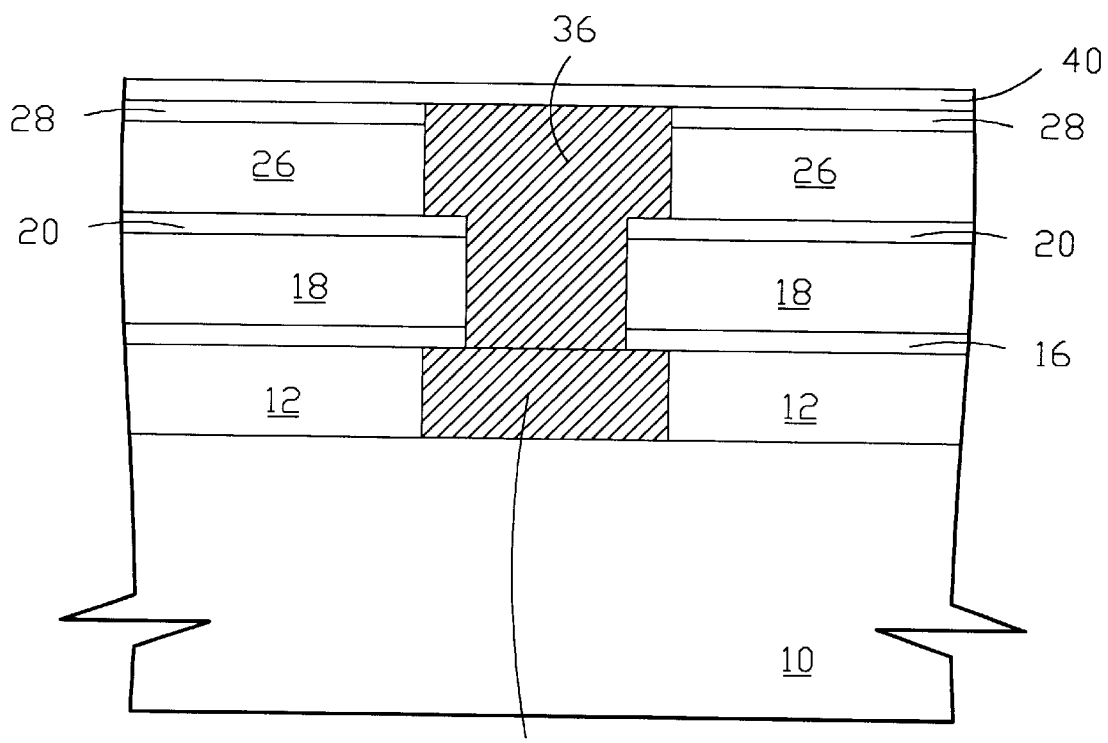
FIG. 6 is a cross-sectional view of a dual damascene structure on the substrate.

Referring to FIG. 6, a metal, copper, is deposited to fill in via opening 32 and the trench opening 34. Generally, when a metallization material is deposited, and excess metal is then removed from the surface of the structure. Accordingly, etching process or polishing technique removes the metal, copper. In the preferred embodiment, chemical mechanical polishing (CMP) method is used to polish away the excess metal copper to form a metal plug 36 on the trench opening 34. Next, the third low-k barrier layer 40 is deposited on the structure to form a covering layer over the exposed metal copper in the trench opening 34, as well as over the top surface of the structure. Then, the filled trench 34 and now operates as the conductive region 14 as the process of the present invention is repeated to form another interconnect structure of subsequent level atop the present metallization level. Thus, by repeating the processes, additional interconnect structures can be fabricated to form additional metallization level on the structure of FIG. 6.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:

forming a dielectric layer on a semiconductor substrate;

forming a barrier layer on said dielectric layer; and treating a surface of said barrier layer by ultraviolet treatment such that a surface characteristic is modified from hydrophobic to less hydrophobic.

2. The method according to claim 1, wherein material of said dielectric layer comprises organic polymer.

3. The method according to claim 1, wherein material of said barrier layer comprises inorganic dielectric material.

4. The method according to claim 3, wherein said forming barrier layer comprises chemical vapor deposition method.

5. The method according to claim l, further comprising an adhesion promoter coated on said barrier layer.

6. A method for forming a dual damascene structure, said method comprising:

providing a semiconductor, structure having a substrate, a first dielectric layer having a conductive region on said substrate thereby forming an interconnect structure, a first barrier layer on said first dielectric layer and said conductive region, a second dielectric layer on said first barrier layer, a second barrier layer on said second dielectric layer, a third dielectric layer on said second barrier layer;

forming a trench in said third dielectric layer, said second barrier layer, said second dielectric layer, and said first barrier layer over a first dielectric layer and said interconnect structure; and treating a surface of said barrier layer by ultraviolet treatment such that a surface characteristic of said first barrier layer and said second barrier layer are modified from hydrophobic to less hydrophobic.

7. The method according to claim 6, wherein said conductive region comprises metal copper.

8. The method according to claim 7, wherein said metal copper is polished by chemical mechanical polishing method.

9. The method according to claim 6, wherein material of said first dielectric layer, said second dielectric layer, and third dielectric layer comprises organic polymer.

10. The method according to claim 6, further comprising a barrier layer formed on said first dielectric layer, said second dielectric layer, and third dielectric layer by chemical vapor deposition method.

11. The method according to claim 10, wherein material of said barrier layer comprises inorganic dielectric material.

12. The method according to claim 6, further comprising an adhesion promoter coated on said first barrier layer and said second barrier layer.

13. The method according to claim 12, further comprising a baking process is performed on said adhesion promoter.

14. A method for forming a dual damascene structure, said method comprising:

providing a semiconductor structure having a substrate, a first organic polymer layer having a conductive region on said substrate thereby forming an interconnect structure, a first inorganic dielectric layer on said first organic polymer layer and said conductive region, a second organic polymer layer on said first inorganic dielectric layer, a second inorganic dielectric layer on said second organic polymer layer, a third organic polymer layer on said second inorganic dielectric layer;

forming a trench in said third organic polymer layer, said second inorganic dielectric layer, said second organic polymer layer, and said first inorganic dielectric layer over said first organic polymer layer and said interconnect structure; and treating a surface of said inorganic dielectric layer by ultraviolet treatment such that a surface characteristic of said first inorganic dielectric layer and said second inorganic dielectric layer are modified from hydrophobic to less hydrophobic.

15. The method according to claim 14, wherein said conductive region comprises metal copper.

16. The method according to claim 15, wherein said metal copper is polished by chemical mechanical polishing method.

17. The method according to claim 14, further comprising an organic polymer layer spun on said first inorganic dielectric layer and said second inorganic dielectric layer.

18. The method according to claim 14, wherein material of said inorganic dielectric layer comprises SiC.

19. The method according to claim 14, further comprising an adhesion promoter coated on said first inorganic dielectric layer and said second inorganic dielectric layer.

20. The method according to claim 19, further comprising a baking process is performed on said adhesion promoter.

* * * * *